(12) United States Patent
Curtis et al.

(10) Patent No.: US 11,016,252 B2
(45) Date of Patent: May 25, 2021

(54) SYSTEMS AND METHODS FOR PROVIDING HEAT-REJECTING MEDIA ON A CABLE ASSEMBLY

(71) Applicant: Dell Products L.P., Round Rock, TX (US)

(72) Inventors: Robert B. Curtis, Georgetown, TX (US); Corey Dean Hartman, Hutto, TX (US); Jonathan Foster Lewis, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/566,193

(22) Filed: Sep. 10, 2019

(65) Prior Publication Data

US 2021/0072472 A1    Mar. 11, 2021

(51) Int. Cl.
   *G02B 6/42*       (2006.01)
   *G02B 6/44*       (2006.01)
   *H05K 7/20*      (2006.01)

(52) U.S. Cl.
   CPC ......... *G02B 6/4269* (2013.01); *G02B 6/4278* (2013.01); *G02B 6/4471* (2013.01); *H05K 7/20409* (2013.01)

(58) Field of Classification Search
   CPC .................................................. G02B 6/4269
   See application file for complete search history.

(56) References Cited

U.S. PATENT DOCUMENTS

| | | | | |
|---|---|---|---|---|
| 9,329,349 B2* | 5/2016 | Ben David | ............. | G02B 6/43 |
| 9,778,430 B2* | 10/2017 | DeMeritt | ............. | G02B 6/4249 |
| 10,164,362 B2* | 12/2018 | Little | .................. | G02B 6/4269 |
| 10,256,578 B2* | 4/2019 | Jandt | .................. | H01R 13/6592 |
| 10,617,037 B2* | 4/2020 | Lee | ...................... | H05K 1/0209 |
| 2017/0285282 A1* | 10/2017 | Regnier | ................ | G02B 6/428 |

* cited by examiner

*Primary Examiner* — Ross N Gushi
(74) *Attorney, Agent, or Firm* — Jackson Walker L.L.P.

(57) ABSTRACT

An active device module may include an active device, a housing configured to house the active device, and heat-rejecting media thermally coupled to the active device and mechanically coupled to the housing such that when the active device module is coupled to an input/output interface of an information handling system, at least a portion of the heat-rejecting media resides external to a chassis enclosing components of the information handling system such that physical shape and size of the heat-rejecting media is not constrained by the chassis.

12 Claims, 8 Drawing Sheets

SYSTEMS AND METHODS FOR PROVIDING HEAT-REJECTING MEDIA ON A CABLE ASSEMBLY

TECHNICAL FIELD

The present disclosure relates in general to information handling systems, and more particularly to systems and methods for providing heat-rejecting media on a cable assembly, such as a cable associated with an optical transceiver module.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may have a network interface or other input/output (I/O) interface configured to receive an optical transceiver module (e.g., a small form-factor pluggable (SFP) transceiver or a quad small form-factor pluggable (QSFP) transceiver of any I/O speed). Such transceiver modules often plug into "cages" disposed on an I/O interface card, which often reside in the rear of the information handling system in which hot air (e.g., at 55° C. to 65° C.) is exhausting from the system. Such temperatures are often near the upper limit of temperature requirements of optical transceiver modules.

In an attempt to reduce temperatures within optical transceiver modules, heatsinks have been implemented in fixed locations on cages disposed on I/O interface cards and configured to receive the optical transceiver modules. However, because such transceivers are removable, thermal interface materials are not used in existing approaches, as such thermal interface materials may be destroyed by multiple instances of insertion and removal of the transceivers. Accordingly, such heatsinks may have limited benefits due to height constraints and a lack of thermal interface material between the heatsink and transceiver.

SUMMARY

In accordance with the teachings of the present disclosure, the disadvantages and problems associated with having multiple external connectors for an information handling system may be reduced or eliminated.

In accordance with embodiments of the present disclosure, an active device module may include an active device, a housing configured to house the active device, and heat-rejecting media thermally coupled to the active device and mechanically coupled to the housing such that when the active device module is coupled to an input/output interface of an information handling system, at least a portion of the heat-rejecting media resides external to a chassis enclosing components of the information handling system such that physical shape and size of the heat-rejecting media is not constrained by the chassis.

In accordance with these and other embodiments of the present disclosure, a method for making an active device module may include housing an active device within a housing and mechanically coupling heat-rejecting media to the housing and thermally coupling the heat-rejecting media to the active device such that when the active device module is coupled to an input/output interface of an information handling system, at least a portion of the heat-rejecting media resides external to a chassis enclosing components of the information handling system such that physical shape and size of the heat-rejecting media is not constrained by the chassis.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
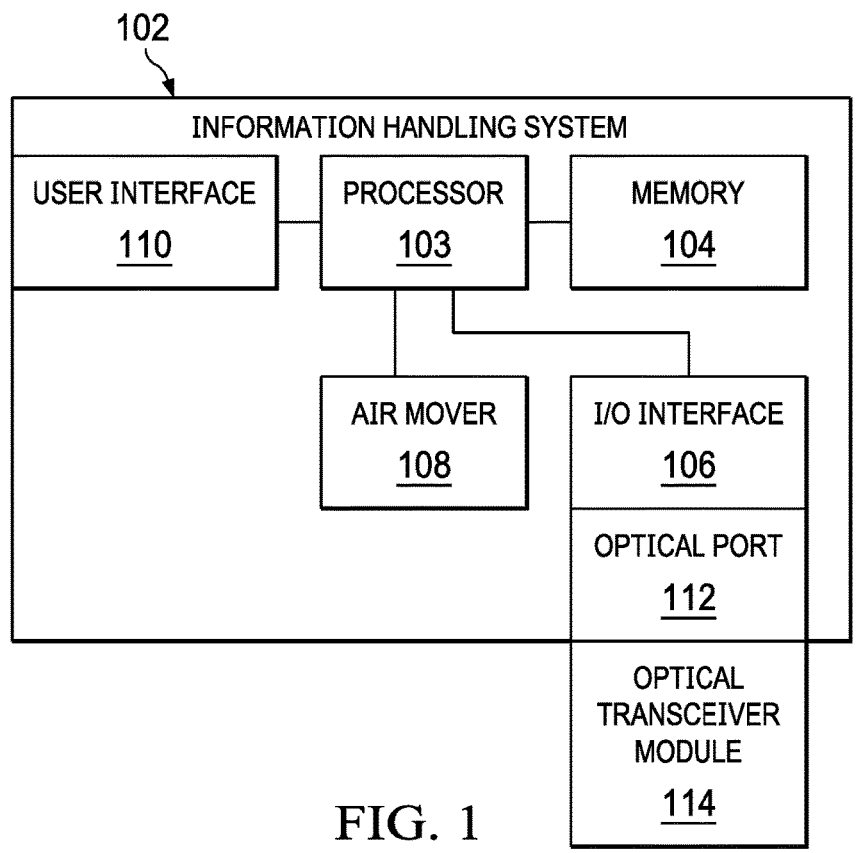
FIG. 1 illustrates a block diagram of selected components of an example information handling system, in accordance with embodiments of the present disclosure.

Preferred embodiments and their advantages are best understood by reference to FIGS. 1 through 12, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a functional block diagram of selected components of an example information handling system 102, in accordance with embodiments of the present disclosure. In some embodiments, information handling system 102 may be a personal computer (e.g., a desktop computer or a portable computer). In other embodiments, information handling system 102 may comprise a storage server for archiving data.

As depicted in FIG. 1, information handling system 102 may include a processor 103, a memory 104 communicatively coupled to processor 103, an input/output interface 106 communicatively coupled to processor 103, an air mover 108 communicatively coupled to processor 103, a user interface 110 communicatively coupled to processor 103, and an optical port 112 communicatively coupled to I/O interface 106.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104, air mover 108, and/or another component of information handling system 102.

Memory 104 may be communicatively coupled to processor 103 and may include any system, device, or apparatus configured to retain program instructions and/or data for a period of time (e.g., computer-readable media). Memory 104 may include random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to its associated information handling system 102 is turned off.

I/O interface 106 may comprise any suitable system, apparatus, or device operable to serve as an interface between information handling system 102 and one or more other external devices. For example, in some embodiments, I/O interface 106 may comprise a network interface configured to serve as an interface between information handling system 102 and information handling systems via a network, in which case I/O interface 106 may comprise a network interface card, or "NIC."

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of system air mover 108 may be driven by a motor. In operation, air mover 108 may cool information handling resources of information handling system 102 by drawing cool air from the outside of and into an enclosure (e.g., chassis) housing the information handling resources, expel warm air from inside the enclosure to the outside of such enclosure, and/or move air across one or more heat sinks (not explicitly shown) internal to or external to the enclosure to cool one or more information handling resources.

User interface 110 may comprise any instrumentality or aggregation of instrumentalities by which a user may interact with information handling system 102. For example, user interface 110 may permit a user to input data and/or instructions into information handling system 102, and/or otherwise manipulate information handling system 102 and its associated components. User interface 110 may also permit information handling system 102 to communicate data to a user, e.g., by way of a display device.

Optical port 112 may comprise an electrical connector in the form of any suitable combination of a jack, a socket, and/or "cage" for receiving a corresponding connector of an optical transceiver module 114.

Optical transceiver module 114 may include any system, device, or apparatus that houses and includes an optical transceiver configured to convert an incoming optical signal into an equivalent electrical signal, and communicate such equivalent electrical signal to I/O interface 106, and also configured to receive an electrical signal from I/O interface 106, convert such electrical signal into an equivalent optical signal, and communicate such optical signal as an outgoing optical signal (e.g., via an optical cable, which may be integral to the same assembly as optical transceiver module 114). Optical transceiver module 114 may include an SFP transceiver, a QSFP transceiver, or any other suitable form factor.

In addition to processor 103, memory 104, I/O interface 106, air mover 108, user interface 110, optical port 112, and optical transceiver module 114, information handling system 102 may include one or more other information handling resources. Such an information handling resource may include any component system, device or apparatus of an information handling system, including without limitation, a processor, bus, memory, I/O device and/or interface, storage resource (e.g., hard disk drives), network interface, electro-mechanical device (e.g., fan), display, power supply, and/or any portion thereof. An information handling resource may comprise any suitable package or form factor, including without limitation an integrated circuit package or a printed circuit board having mounted thereon one or more integrated circuits.

Figure 2:
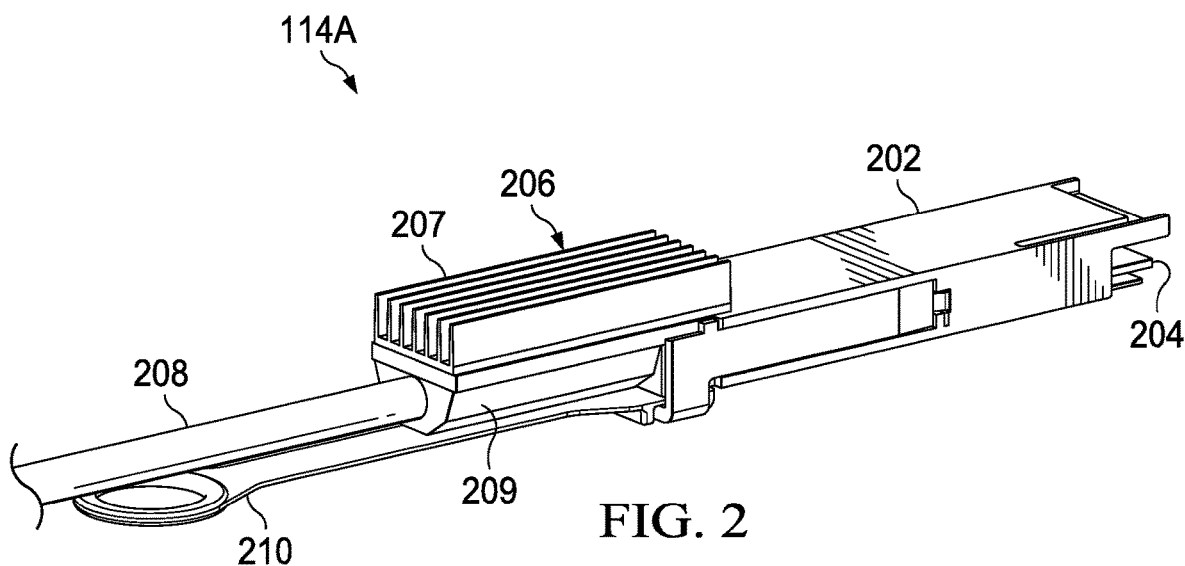
FIG. 2 illustrates a perspective view of an example optical transceiver module, in accordance with embodiments of the present disclosure.

FIG. 2 illustrates a perspective view of an example optical transceiver module 114A, in accordance with embodiments of the present disclosure. In some embodiments, example optical transceiver module 114A depicted in FIG. 2 may be used to implement optical transceiver module 114 of FIG. 1. As shown in FIG. 2, optical transceiver module 114A may include a housing 202 for housing an optical transceiver 204 and one or more other components, a heatsink 206, a cable 208, a strain relief feature 209, and one or more servicing features 210. Housing 202 may comprise a metal enclosure configured to house and/or provide mechanical structure for optical transceiver 204, including mechanical features (e.g., guiding features) for aligning and/or mechanically securing optical transceiver 204 to I/O interface 106 via optical port 112.

Optical transceiver 204 may include any system, device, or apparatus configured to receive an incoming optical signal (e.g., via cable 208), convert the incoming optical signal into an equivalent electrical signal, and communicate such equivalent electrical signal to I/O interface 106 (e.g., via optical port 112), and also configured to receive an electrical signal from I/O interface 106 (e.g., via optical port 112), convert such electrical signal into an equivalent optical signal, and communicate such optical signal as an outgoing optical signal (e.g., via cable 208).

Heatsink 206 may be mechanically and thermally coupled to housing 202, and thus may also be thermally coupled to optical transceiver 204. Heatsink 206 may include any system, device, or apparatus configured to transfer heat from an information handling resource (e.g., optical transceiver 204), thus reducing a temperature of the information handling resource. As shown in FIG. 2, heatsink 206 may include a plurality of generally parallel fins 207 which are generally parallel with the axial direction of cable 208 (and thus, generally parallel with the direction of exhaust airflow from information handling system 102). As described in greater detail below, when optical transceiver module 114A is coupled to I/O interface 106 via optical port 112, heatsink 206 may be at least partially exterior to the volume of the chassis enclosing components of information handling system 102, such that heat transfer from optical transceiver 204 through heatsink 206 occurs outside of the volume of the chassis. Thus, exhaust from the cooling system of information handling system 102 (e.g., impelled from air mover 108) may pass over the various surfaces of the fins 207 of heatsink 206 externally to the enclosure of information handling system 102, thus cooling heatsink 206 and in turn cooling optical transceiver 204.

Although heatsink 206 is shown in FIG. 2 as being separate from housing 202, in some embodiments, heatsink 206 may be integrated into housing 202 (e.g., in embodiments in which housing 202 includes a separate top plate, as described below).

Cable 208 may include any suitable system, device, or apparatus capable of passing optical signals therethrough. For example, cable 208 may include one or more optical fibers surrounded by optically opaque material and/or material for protecting such one or more optical fibers. Such one or more optical fibers integral to cable 208 may be optically coupled to optical transceiver 204, thus enabling communication with optical transceiver 204 via such optical fibers.

Strain relief feature 209 may mechanically enclose cable 209 in proximity to heatsink 206 (and the top plate extension of housing 202), and may be formed from any suitable material that may be configured to provide strain relief to cable 208 while also providing support to the extension of housing 202.

Servicing features 210 may include one or more mechanical features (e.g., mechanical pull tabs, mechanical latches, etc.) to aid a technician in inserting optical transceiver module 114 into and/or removing optical transceiver module 114 from optical port 112.

Thus, in optical transceiver module 114A, housing 202 may be extended (as compared with existing optical transceiver modules), allowing for placement of heatsink 206 on housing 202. In embodiments represented by optical transceiver module 114A, such extension of housing 202 may be made from the same material as the rest of housing 202, or housing 202 may be constructed in such a way that its top plate is made from a material with higher thermal conductivity in order to enhance heat transfer toward heatsink 206.

Figure 3:
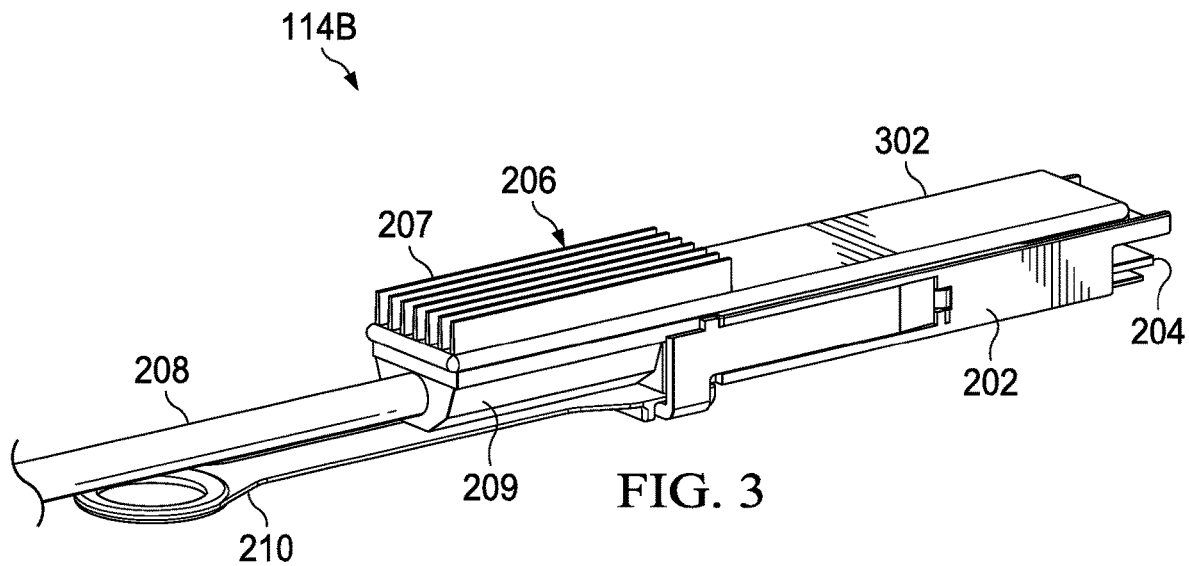
FIG. 3 illustrates a perspective view of another example optical transceiver module, in accordance with embodiments of the present disclosure.

FIG. 3 illustrates a perspective view of an example optical transceiver module 114B, in accordance with embodiments of the present disclosure. In some embodiments, example optical transceiver module 114B depicted in FIG. 3 may be used to implement optical transceiver module 114 of FIG. 1. In many respects, optical transceiver module 114B depicted in FIG. 3 may be similar to optical transceiver module 114A depicted in FIG. 2, and thus, only the main differences between optical transceiver module 114B depicted in FIG. 3 and optical transceiver module 114A depicted in FIG. 2 are discussed below.

As shown in FIG. 3, optical transceiver module 114B may include a heat spreader 302 mechanically coupled to a top plate of housing 202 and mechanically (and thermally) coupled to heatsink 206. Heat spreader 302 may include any suitable system, device, or apparatus for thermally conducting heat from optical transceiver 204 to heatsink 206. In some embodiments, heat spreader 302 may comprise a metal (e.g., copper, aluminum) plate. In other embodiments, heat spreader 302 may comprise a heat pipe. In some embodiments, heat spreader 302 may be integrated into a top plate of housing 202. In these and other embodiments, heat spreader 302 may be integrated with heatsink 206.

Figure 4:
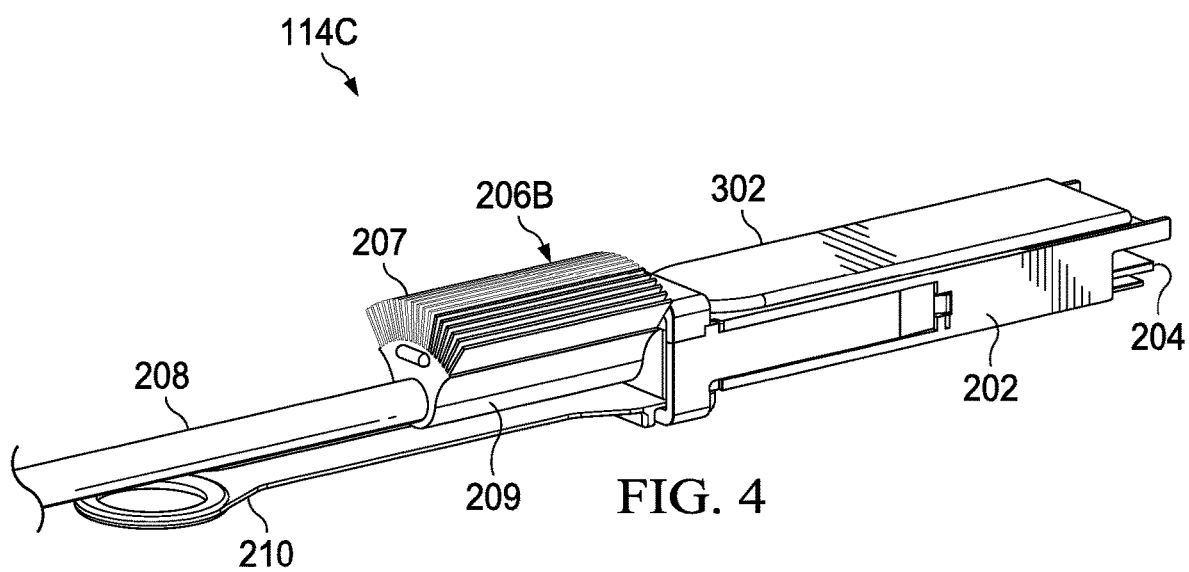
FIG. 4 illustrates a perspective view of yet another example optical transceiver module, in accordance with embodiments of the present disclosure.

FIG. 4 illustrates a perspective view of an example optical transceiver module 114C, in accordance with embodiments of the present disclosure. In some embodiments, example optical transceiver module 114C depicted in FIG. 4 may be used to implement optical transceiver module 114 of FIG. 1. In many respects, optical transceiver module 114C depicted in FIG. 4 may be similar to optical transceiver module 114B depicted in FIG. 3, and thus, only the main differences between optical transceiver module 114C depicted in FIG. 4 and optical transceiver module 114B depicted in FIG. 3 are discussed below.

As shown in FIG. 4, a heatsink 206B may be used in lieu of heatsink 206. Heatsink 206B may be integrated within strain feature 209 and may be shaped (e.g., in a partially-circular manner), such that the integrated heatsink 206B and strain feature 209 provide strain relief for cable 208.

Figure 5:
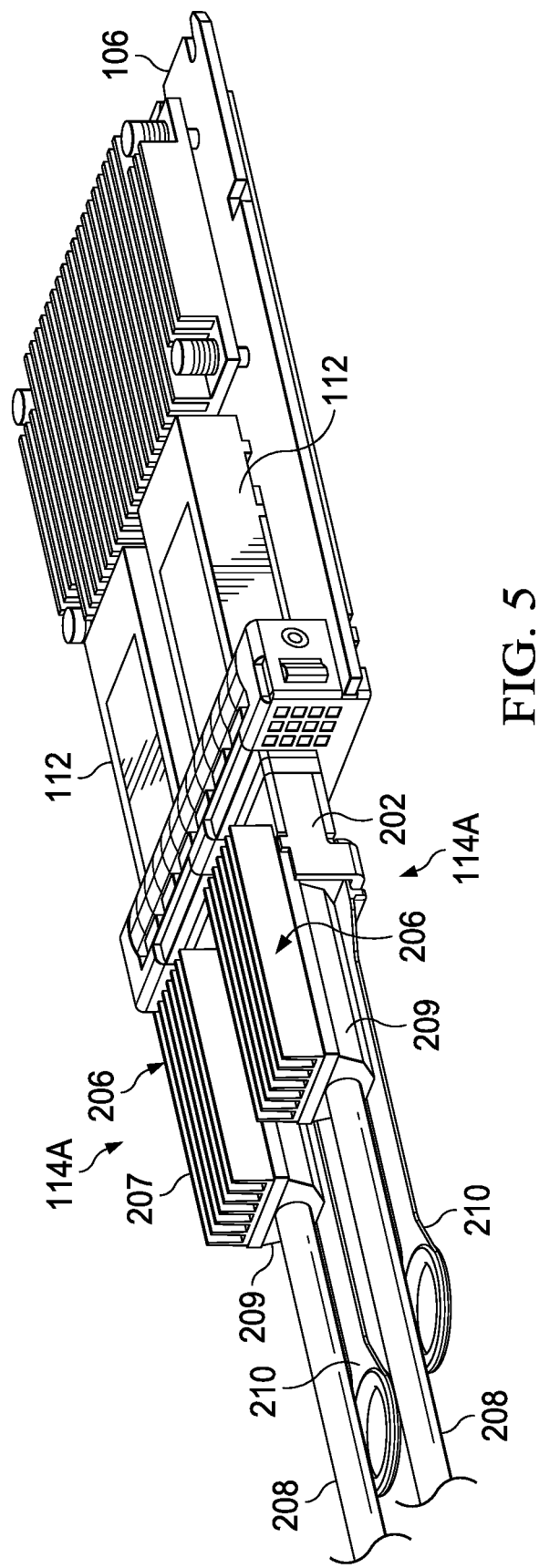
FIG. 5 illustrates a perspective view of two instances of the example optical transceiver module shown in FIG. 2 inserted into respective optical ports of an I/O interface, in accordance with embodiments of the present disclosure.
Figure 6:
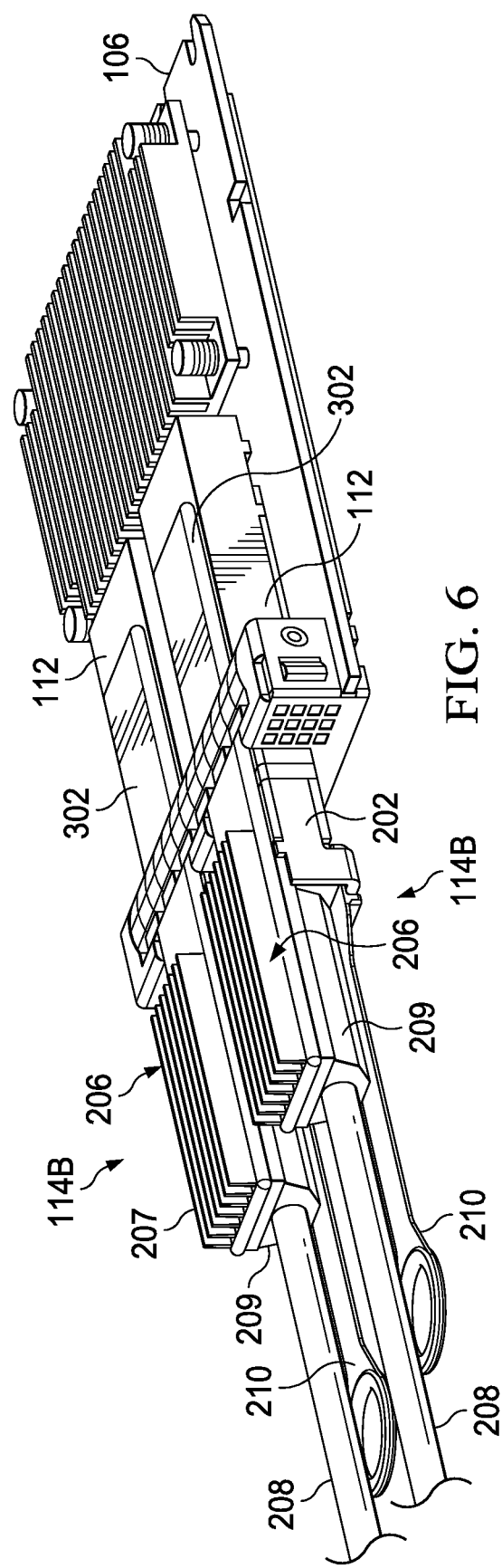
FIG. 6 illustrates a perspective view of two instances of the example optical transceiver module shown in FIG. 3 inserted into respective optical ports of an I/O interface, in accordance with embodiments of the present disclosure.
Figure 7:
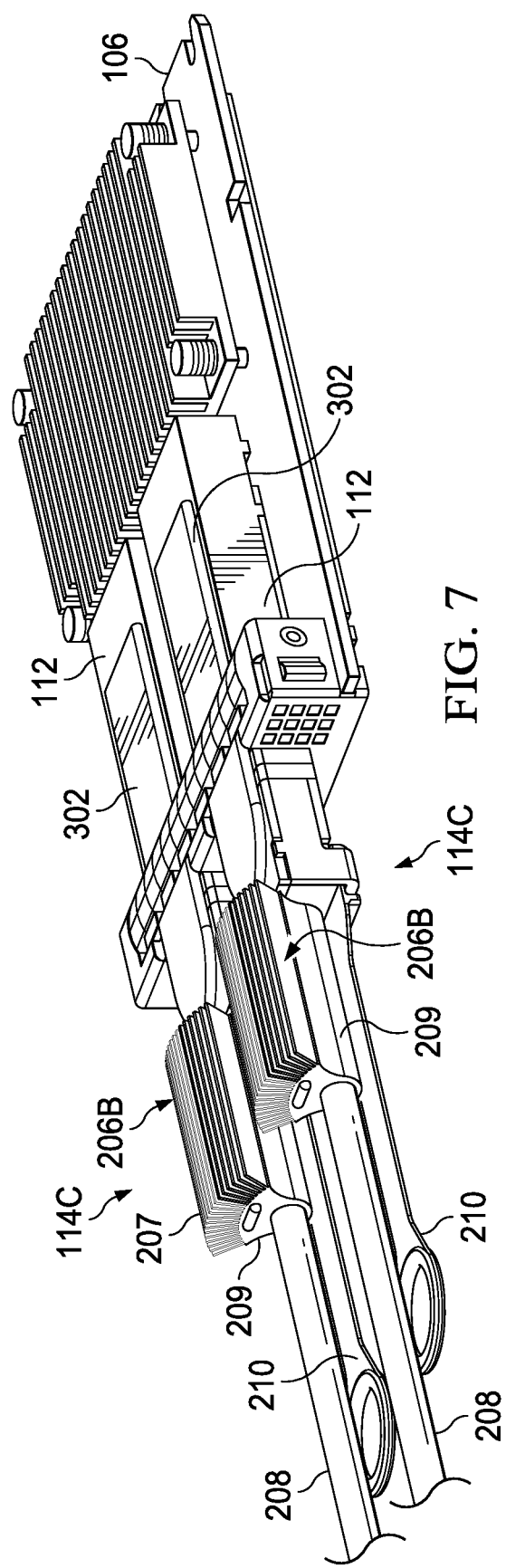
FIG. 7 illustrates a perspective view of two instances of the example optical transceiver module shown in FIG. 4 inserted into respective optical ports of an I/O interface, in accordance with embodiments of the present disclosure.

FIG. 5 illustrates a perspective view of two instances of example optical transceiver module 114A shown in FIG. 2 inserted into respective optical ports 112 of I/O interface 106, in accordance with embodiments of the present disclosure. Similarly, FIG. 6 illustrates a perspective view of two instances of example optical transceiver module 114B shown in FIG. 3 inserted into respective optical ports 112 of I/O interface 106, in accordance with embodiments of the present disclosure. Likewise, FIG. 7 illustrates a perspective view of two instances of example optical transceiver module 114C shown in FIG. 4 inserted into respective optical ports 112 of I/O interface 106, in accordance with embodiments of the present disclosure. As shown in each of FIGS. 5-7, given that the end of optical ports 112 configured to receive optical transceiver modules 114 (e.g., optical transceiver modules 114A, 114B, and 114C) may be proximate to a boundary of the enclosure of information handling system 102, each optical transceiver module 114 may include heat-rejecting media (e.g., heatsinks 208 and/or at least a portion of heat spreaders 302) exterior to such enclosure and configured to carry away heat from their respective optical transceivers 204. Further, such heat-rejecting media, in particular heat sinks 208, may be in a path of air exhausted from information handling system 102, which may also aid in transferring heat from optical transceivers 204.

Thus, as described above (and further below), the systems and methods herein provide for heatsink placement associated with an optical transceiver module 114 being outside of information handling system 102. This may provide distinct advantages over existing approaches, as at optical port 112, heatsinks may be limited to space constraints within information handling system 102, while outside of information handling system 102, more space is available for heatsinks, and thus, heatsinks may be made larger if placed outside the enclosure of information handling system 102.

Figure 8:
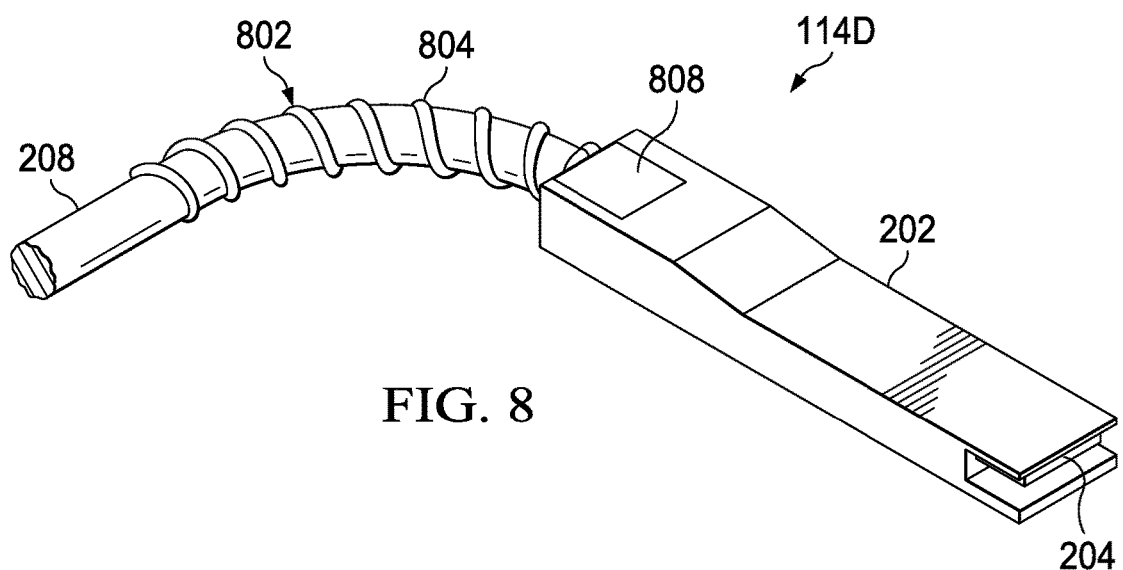
FIG. 8 illustrates a perspective view of another example optical transceiver module, in accordance with embodiments of the present disclosure.
Figure 9:
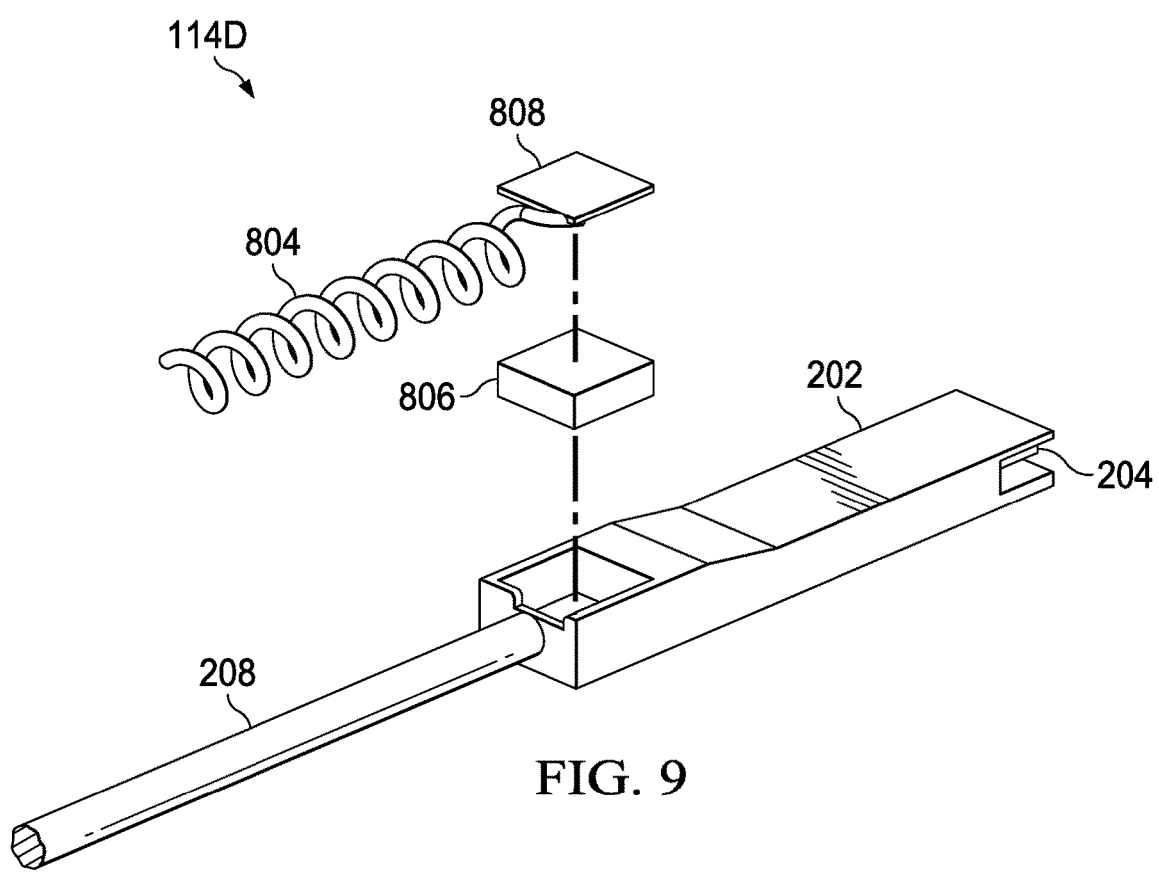
FIG. 9 illustrates an exploded perspective view of the example optical transceiver module shown in FIG. 8, in accordance with embodiments of the present disclosure.

FIG. 8 illustrates a perspective view of another example optical transceiver module 114D, in accordance with embodiments of the present disclosure, while FIG. 9 illustrates an exploded perspective view of example optical transceiver module 114D, in accordance with embodiments of the present disclosure. In some embodiments, example optical transceiver module 114D depicted in FIGS. 8 and 9 may be used to implement optical transceiver module 114 of FIG. 1. In many respects, optical transceiver module 114D depicted in FIGS. 8 and 9 may be similar to optical transceiver modules 114A-C depicted in FIGS. 3-5, and thus, only the main differences between optical transceiver module 114D depicted in FIGS. 8 and 9 and optical transceiver modules 114A-C depicted in FIGS. 3-5 are discussed below. A key difference between optical transceiver module 114D and optical transceiver modules 114A-C is that heat-rejecting media 802 may employ a thermally-conductive cable wrap in lieu of heatsinks 206 and 206B.

As shown in FIGS. 8 and 9, heat-rejecting media 802 may include a heat transfer surface (e.g., thermally-conductive plate 808) that more directly contacts a heat source 806 (e.g., optical transceiver 204), potentially minimizing thermal resistance and potentially maximizing heat transfer. Further, thermally-conductive wire 804 (or 1004 as shown in FIG. 10 below) may wrap around cable 208 (e.g., in a spiraling shape) and conform to the shape of cable 208 (e.g., regardless of which direction cable 208 is routed), thus ensuring equal flexible routing of cable 208 and ensuring maintenance of surface area of the heat rejection surface regardless of cable orientation.

Figure 10:
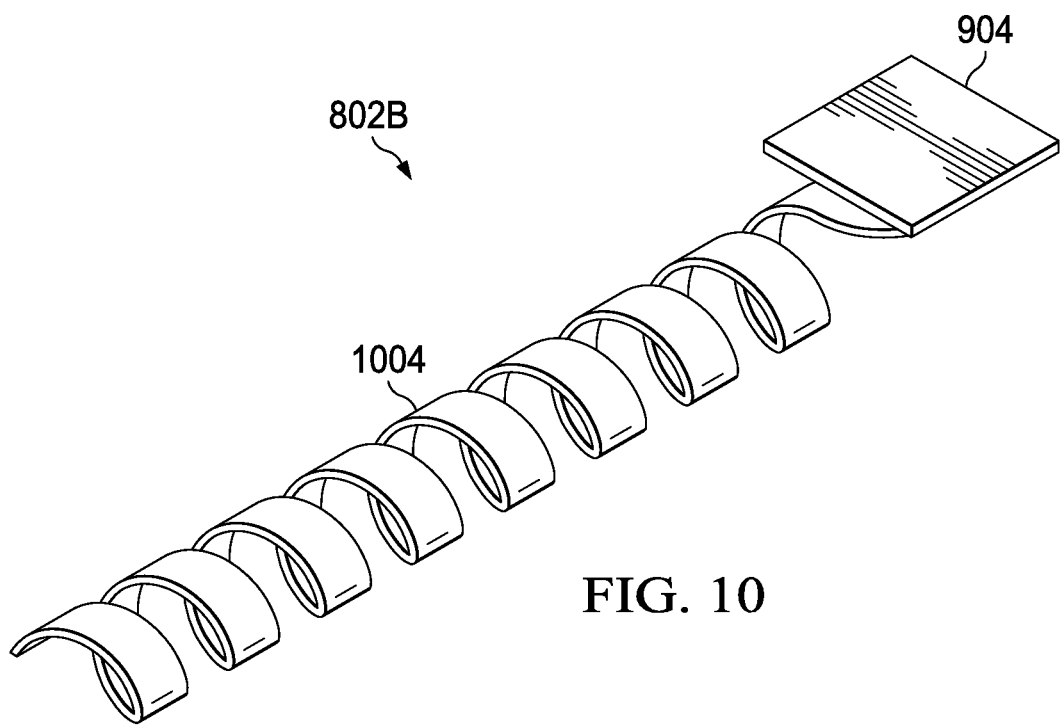
FIG. 10 illustrates a perspective view of other heat-rejecting media that may be used with the example optical transceiver module shown in FIGS. 8 and 9, in accordance with embodiments of the present disclosure.

FIG. 10 illustrates a perspective view of heat-rejecting media 802B, in accordance with embodiments of the present disclosure. As shown in FIG. 10, heat-rejecting media 802B may be similar to heat-rejecting media 802, except that thermally-conductive material 1004 used in heat-rejecting media 802B may be wider in the axial direction of optical cable 208 than that of thermally-conductive wire 904 used in heat-rejecting media 802. For example, thermally-conductive material 1004 used in heat-rejecting media 802B may be formed from a sheet of conductive material that offers a greater surface area for heat rejection as compared to thermally-conductive wire 804 used in heat-rejecting media 802.

Figure 11:
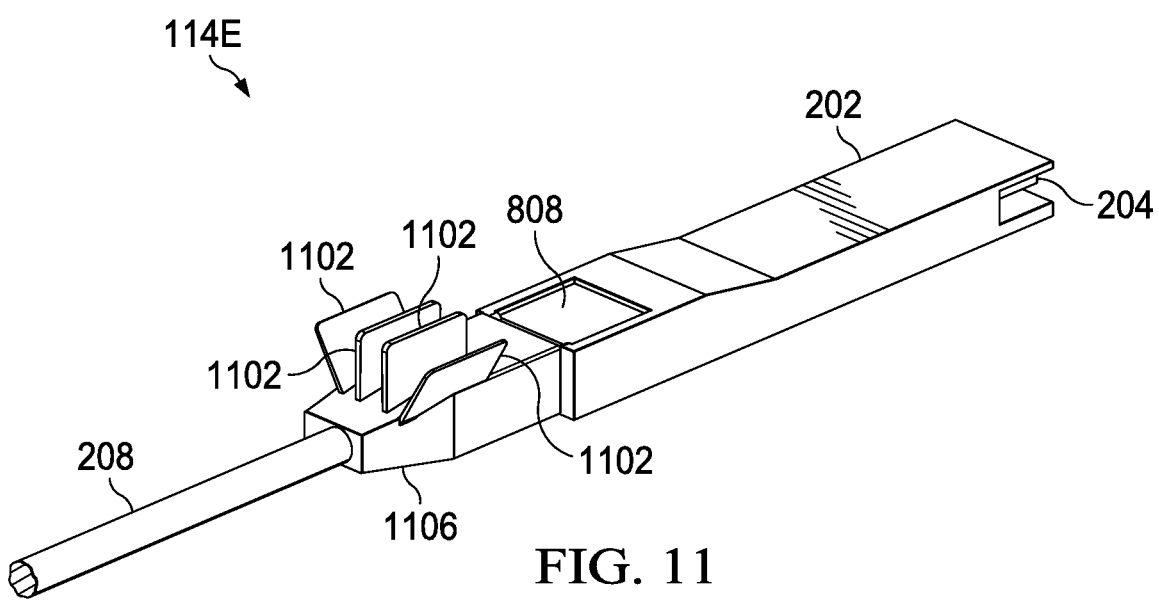
FIG. 11 illustrates a perspective view of another example optical transceiver module, in accordance with embodiments of the present disclosure.
Figure 12:
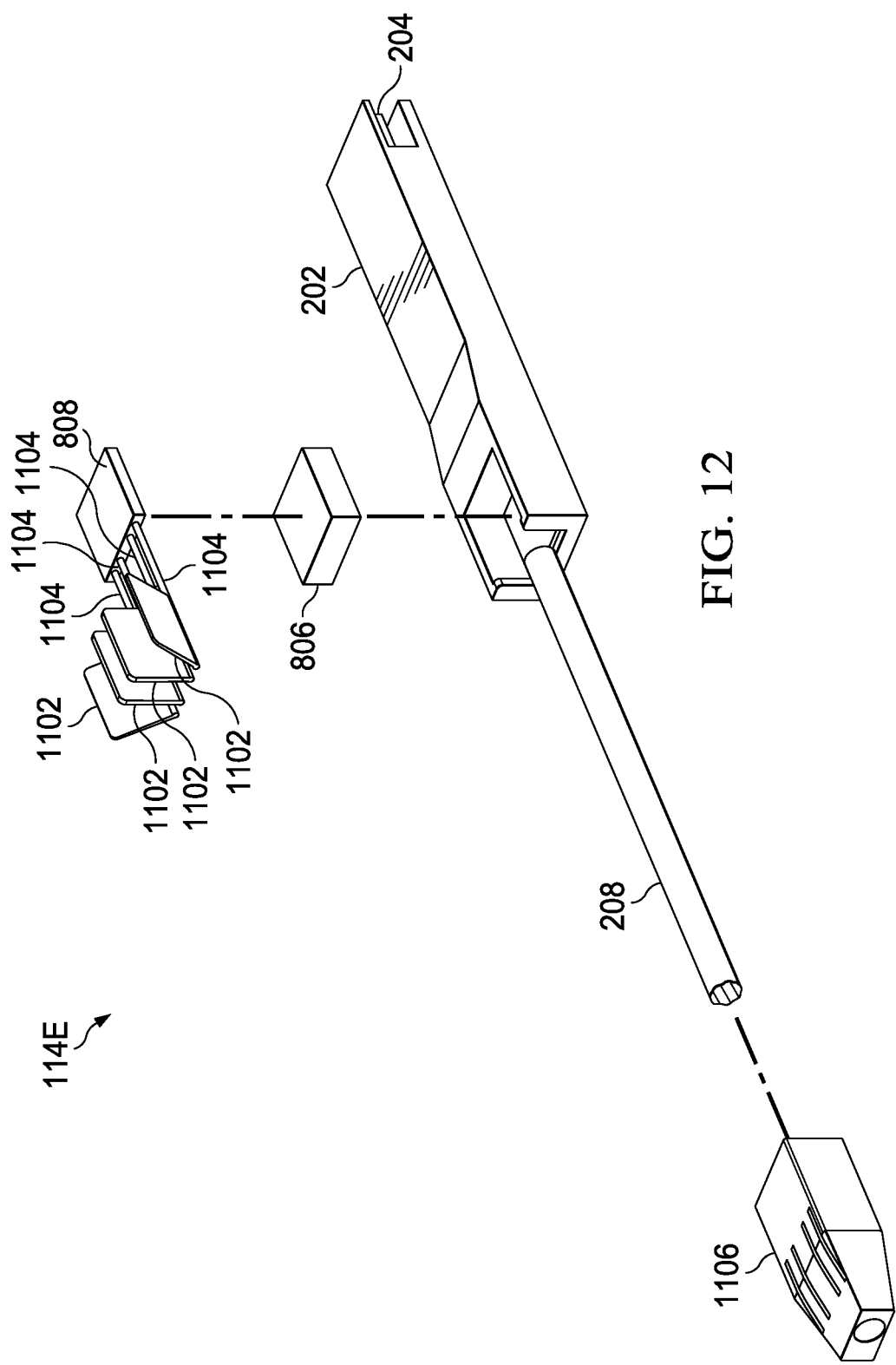
FIG. 12 illustrates an exploded perspective view of the example optical transceiver module shown in FIG. 11, in accordance with embodiments of the present disclosure.

FIG. 11 illustrates a perspective view of another example optical transceiver module 114E, in accordance with embodiments of the present disclosure. FIG. 12 illustrates an exploded perspective view of example optical transceiver module 114E, in accordance with embodiments of the present disclosure. In some embodiments, example optical transceiver module 114E depicted in FIGS. 11 and 12 may be used to implement optical transceiver module 114 of FIG. 1. In many respects, optical transceiver module 114E depicted in FIGS. 11 and 12 may be similar to optical transceiver module 114D depicted in FIGS. 8 and 9, and thus, only the main differences between optical transceiver module 114E depicted in FIGS. 11 and 12 and optical transceiver module 114D depicted in FIGS. 8 and 9 are discussed below. A key difference between optical transceiver module 114E and optical transceiver module 114D is that optical transceiver module 114E may include one or more flexible, thermally-conductive wires 1104 thermally coupled to a heat transfer material such as thermally-conductive plate 808, one or more thermally-conductive fins 1102 thermally coupled to thermally-conductive wire 1104 and oriented in a direction away from the axis of cable 208, with an overmold 1106 applied to cable 208 and thermally-conductive wire 1104, leaving thermally-conductive fins 1102 exposed to air (and exposed to exhaust of information handling system 102). Thus, similar to how an overmold may typically be applied to a cable for strain relief, overmold 1106 may mechanically and/or structurally support thermal conduction features (e.g., thermally-conductive wire 1102 and thermally-conductive fins 1104) in optical transceiver module 114E.

Although the foregoing contemplates the use of the methods and systems disclosed herein in direct attached copper and active optical cable solutions, embodiments disclosed herein may be extended for use in unique form factors and constraints of pluggable optical transceivers. Although the foregoing contemplates the use of the methods and systems disclosed herein with respect to cable-attached optical transceiver modules, the heat transfer techniques disclosed herein may be applied generally to any active device module having a heat-generating device coupled to a cable, including without limitation transceiver modules other than optical transceiver modules.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An active device module, comprising:
   an active device;
   a cable coupled to the active device;
   a housing configured to house the active device; and
   heat-rejecting media thermally coupled to the active device and mechanically coupled to the housing such that when the active device module is coupled to an input/output interface of an information handling system:
      at least a portion of the heat-rejecting media resides external to a chassis enclosing components of the information handling system such that physical shape and size of the heat-rejecting media is not constrained by the chassis; and
      the heat rejecting media dissipates heat generated internal to the chassis by the active device;
   wherein the heat-rejecting media is integrated within a strain relief feature configured to provide strain relief to the cable, such that a plurality of fins of the heat-rejecting media are parallel to an axis of the cable and extend along the cable for a selected distance external to the chassis, such that air exhausted from the chassis is operable to flow along the plurality of fins.

2. The active device module of claim 1, wherein the heat-rejecting media comprises a heatsink.

3. The active device module of claim 2, wherein the heat-rejecting media further comprises a heat spreader mechanically coupled to the housing and thermally coupled to the heatsink.

4. The active device module of claim 1, wherein the strain relief feature is configured to provide mechanical support of an extension of the housing to which the heat-rejecting media is mechanically coupled.

5. The active device module of claim 1, wherein the heat-rejecting media comprises:
   a thermally-conductive plate mechanically and thermally coupled to the housing; and
   an extension of thermally-conductive material mechanically and thermally coupled to the thermally-conductive plate wrapped around the cable such that the extension of thermally-conductive material conforms to a shape and a position of the cable.

6. The active device module of claim 1, wherein the heat-rejecting media comprises:
   a thermally-conductive wire thermally coupled to the active device;
   one or more thermally-conductive fins thermally coupled to the thermally-conductive wire; and
   an overmold surrounding the cable and thermally-conductive wire such that the fins are exposed and extend from the combination of the overmold and the cable.

7. A method for making an active device module comprising:
   housing an active device within a housing;
   communicatively coupling a cable to the active device; and
   mechanically coupling heat-rejecting media to the housing and thermally coupling the heat-rejecting media to the active device such that when the active device module is coupled to an input/output interface of an information handling system:
      at least a portion of the heat-rejecting media resides external to a chassis enclosing components of the information handling system such that physical shape and size of the heat-rejecting media is not constrained by the chassis; and
      the heat-rejecting media dissipates heat generated internal to the chassis by the active device;
   wherein the heat-rejecting media is integrated within a strain relief feature configured to provide strain relief to the cable, such that a plurality of fins of the heat-rejecting media are parallel to an axis of the cable and extend along the cable for a selected distance external to the chassis, such that air exhausted from the chassis is operable to flow along the plurality of fins.

8. The method of claim 7, wherein the heat-rejecting media comprises a heatsink.

9. The method of claim 8, wherein the heat-rejecting media further comprises a heat spreader mechanically coupled to the housing and thermally coupled to the heatsink.

10. The method of claim 7, wherein the strain relief feature is configured to provide mechanical support of an extension of the housing to which the heat-rejecting media is mechanically coupled.

11. The method of claim 7, wherein the heat-rejecting media comprises:
   a thermally-conductive plate mechanically and thermally coupled to the housing; and
   an extension of thermally-conductive material mechanically and thermally coupled to the thermally-conductive plate wrapped around the cable such that the extension of thermally-conductive material conforms to a shape and a position of the cable.

12. The method of claim 7, wherein the heat-rejecting media comprises:
   a thermally-conductive wire thermally coupled to the active device;
   one or more thermally-conductive fins thermally coupled to the thermally-conductive wire; and
   an overmold surrounding the cable and thermally-conductive wire such that the fins are exposed and extend from the combination of the overmold and the cable.

* * * * *